United States Patent [19]

Arai et al.

[11] Patent Number: 5,591,988
[45] Date of Patent: Jan. 7, 1997

[54] SOLID STATE IMAGING DEVICE WITH LOW TRAP DENSITY

[75] Inventors: Michio Arai, Tokyo; Takashi Inushima, Kanagawa; Mitsufumi Codama, Kanagawa; Kazushi Sugiura, Kanagawa; Ichiro Takayama, Kanagawa; Isamu Kobori, Kanagawa; Yukio Yamauchi, Kanagawa; Naoya Sakamoto, Kanagawa, all of Japan

[73] Assignees: TDK Corporation, Tokyo; Semiconductor Energy Lab. Co. Ltd., Kanagawa, both of Japan

[21] Appl. No.: 477,104

[22] Filed: Jun. 7, 1995

Related U.S. Application Data

[62] Division of Ser. No. 343,492, filed as PCT/JP94/00452, Mar. 22, 1994.

[30] Foreign Application Priority Data

Mar. 23, 1993 [JP] Japan ........................ 5-63789
Nov. 19, 1993 [JP] Japan ....................... 5-314135

[51] Int. Cl.⁶ ..................... H01L 29/04; H01L 31/036; H01L 31/0376; H01L 31/20
[52] U.S. Cl. ............... 257/59; 257/66; 257/72; 257/291; 257/292; 437/3; 437/174; 437/907; 437/908
[58] Field of Search ................... 257/59, 66, 72, 257/291, 292; 437/3, 4, 19, 174, 907, 908

[56] References Cited

U.S. PATENT DOCUMENTS

| | | | |
|---|---|---|---|
| 4,598,305 | 7/1986 | Chiang et al. | 257/226 X |
| 5,221,365 | 6/1993 | Noguchi et al. | 437/4 X |
| 5,254,480 | 10/1993 | Tran | 437/4 X |
| 5,273,910 | 12/1993 | Tran et al. | 437/3 |
| 5,289,030 | 2/1994 | Yamazaki et al. | 257/66 X |
| 5,313,075 | 5/1994 | Zhang et al. | 257/66 X |
| 5,413,958 | 5/1995 | Imahashi et al. | 437/173 |

FOREIGN PATENT DOCUMENTS

| | | |
|---|---|---|
| 51-54790 | 5/1976 | Japan. |
| 61-7663 | 1/1986 | Japan. |
| 63-29924 | 2/1988 | Japan. |
| 210877 | 2/1990 | Japan. |
| 2-181419 | 7/1990 | Japan. |
| 3-9562 | 1/1991 | Japan. |
| 3-23671 | 1/1991 | Japan. |

*Primary Examiner*—William Mintel
*Attorney, Agent, or Firm*—Martin Novack

[57] ABSTRACT

A substrate (1) has a surface covered with an insulation layer (2), on which an active layer (3') made of non-single crystal silicon through thin film technique is provided. A gate electrode layer (5') is partially provided on said active layer through a gate insulation layer (4). Said active layer (3') is subject to injection of P-type or N-type impurities to provide an image sensor of MOS structure. Bias potential is applied to a gate electrode so that a circuit between a source and a drain is in an On state, so that input light through said substrate or said gate electrode is applied to said active layer, and electrical output depending upon said input light is obtained from said source electrode or said drain electrode. Other MOS transistors for switching element and/or shift registers for operating said image sensor are provided on said substrate (1). Said active layer (3') is obtained by crystallizing said amorphous silicon layer through a laser anneal process or a high temperature anneal process, and hydrogenation process, and the trap density of said active layer is less than $5 \times 10^{11}/cm^2$. Optical response time is short, less than 500 μsec, so, high speed operation ten times as high as that of a prior image sensor is possible.

11 Claims, 11 Drawing Sheets

SOLID STATE IMAGING DEVICE WITH LOW TRAP DENSITY

This is a divisional of copending U.S. application Ser. No. 08/343,492, filed Nov. 22, 1994, which is a 35 USC 371 National Stage of PCT International Application PCT/JP94/00452, filed Mar. 22, 1994, which claims priority from Japanese Patent Application 63789/1993 filed Mar. 23, 1993 and Japanese Patent Application 314135/1993 filed Nov. 19, 1993.

FILED OF THE INVENTION

The present invention relates to a solid state imaging device and method for producing such a device, and in particular, relates to such a device and a method in which it has quick optical response time, a single common substrate may mount both an imaging device and transistors and/or switching elements for operating the imaging device, and plane operation is possible.

Recently, following the development of facsimile system, an imaging device or an image sensor is required be smaller in size, lighter in weight, and cheaper in cost. An image sensor used in facsimile systems is classified into three kinds: non-contact type, contact type, and complete contact type.

A non-contact type image sensor projects an image of a document on a CCD (charge coupled device) which has a single crystal PN junction, through a lens system. It is produced through a LSI process which has been established, and therefore, it has high productivity and has the advantage of low cost. However, it has the problems of volume and weight, as it must have a lens system.

A contact type and a complete contact type are superior to non-contact type in volume and weight. However, they have problems in producing process, and cost for assembling. Further, a contact type has the problem that it must use an expensive selfoc lens array. A complete contact type does not use a selfoc lens array. A contact type is superior in cost as it uses a thin glass as a substrate.

As for a contact type image sensor which is used in a facsimile system, a multi-chip type which mounts many MOS-LSI chips on a substrate, and a thin film type which uses a photo-diode made of amorphous silicon film as an optical sensor have been known. Those use a selfoc lens array.

A multi-chip type has the advantage that it has high producing yield rate and stable supply is possible, as it is produced through MOS-LSI process which is an established technique. However, it has the disadvantage that the characteristics are not uniform due to fabrication error.

On the other hand, as for a thin film type which is produced on an insulation substrate like glass or ceramics through thin film process, it is possible to obtain an image sensor with large area, and/or an image sensor having length equal to that of a manuscript. However, it has the disadvantage that the producing cost is high because it has many producing steps, and the producing yield rate is low.

As for an optical-electrical converter for an image sensor, a photo conductor type and a photo diode type have been known.

A photo conductor type measures resistance of an element made of for instance amorphous silicon which has the characteristics that resistance reduces upon illumination. A photo conductor type has the advantage that it less affected by noise since much current is flows through the element. However, it is not useful for high speed facsimile systems, as photo response is slow.

A photo diode type operates by taking carriers generated in depletion layer upon illumination in PIN junction by reversely biased potential. A photo diode type has the advantage that photo response is very quick. However, it has the disadvantage that it is much affected by noise as small current flows in a photo diode.

Further, a photo diode type has the disadvantage that the producing yield rate is low due to many complicated producing steps, since a photo diode is produced through steps different from those for reading circuits for the photo diode. Further, when a reading circuit is an external circuit, many chips must be used, and therefore, the total producing cost must be high.

Another prior art approach is shown in JP patent laid open publication 210877/1990 which uses a bipolar transistor. However, it has the disadvantage that it is difficult to produce a PN junction, and difficult for practical use.

In the above analysis, our conclusion is that a future solid state image sensor is an MOS thin film structure produced through LSI process.

However, a prior MOS silicon structure using amorphous silicon has the disadvantages that it is not preferable for facsimile use since optical response time is slow in the order of 5000 μsec, and the producing steps are complicated and the producing cost is high, since related MOS transistors like switching elements and shift registers for operating the image sensor are produced through different steps from those of the image sensor.

The object of the present invention is to overcome above disadvantages.

Another object of the present invention is to provide a solid state image sensor and a method for producing the same in which the image sensor has quick optical response time, related transistors are produced on a common substrate at the same time as the image sensor, and plane operation of the image sensor is possible.

SUMMARY OF THE INVENTION

The present invention for attaining said objects is a solid state imaging device comprising; a substrate having insulation surface; an active layer of non-single crystal silicon layer provided on said insulation surface, having at least a source region and a drain region; a gate electrode layer provided on light receiving region between said source region and said drain region on said active layer through a gate insulation layer; a source electrode layer and a drain electrode layer each provided on said source region and said drain region, respectively; trap density of said active layer being less than $5 \times 10^{11}/cm^2$; said gate electrode layer being provided a predetermined bias potential; and electrical output of current between said source electrode layer and said drain electrode layer being provided depending upon input light which illuminates said light receiving region on said active layer.

In the above structure, it is a feature of the present invention that an active layer is non-single crystal silicon layer, or multi-crystal silicon layer.

A non-single crystal silicon layer is obtained by annealing amorphous silicon layer. The anneal process may be either a laser anneal, or high temperature anneal higher than 600° C.

As a non-single crystal silicon layer is also used for a MOS transistor, both an image sensor and the related MOS transistors are produced on a common non-single crystal silicon layer.

In order to provide quick optical response time, it is preferable that the trap density of an active layer is less than $5\times10^{11}/cm^2$, and an active layer is hydrogenated.

It is also a feature of the present invention that the source drain path is biased in conductive state. In a prior art, a source drain path is biased in non-conductive state.

DESCRIPTION OF THE PREFERRED EMBODIMENTS

Figure 1:
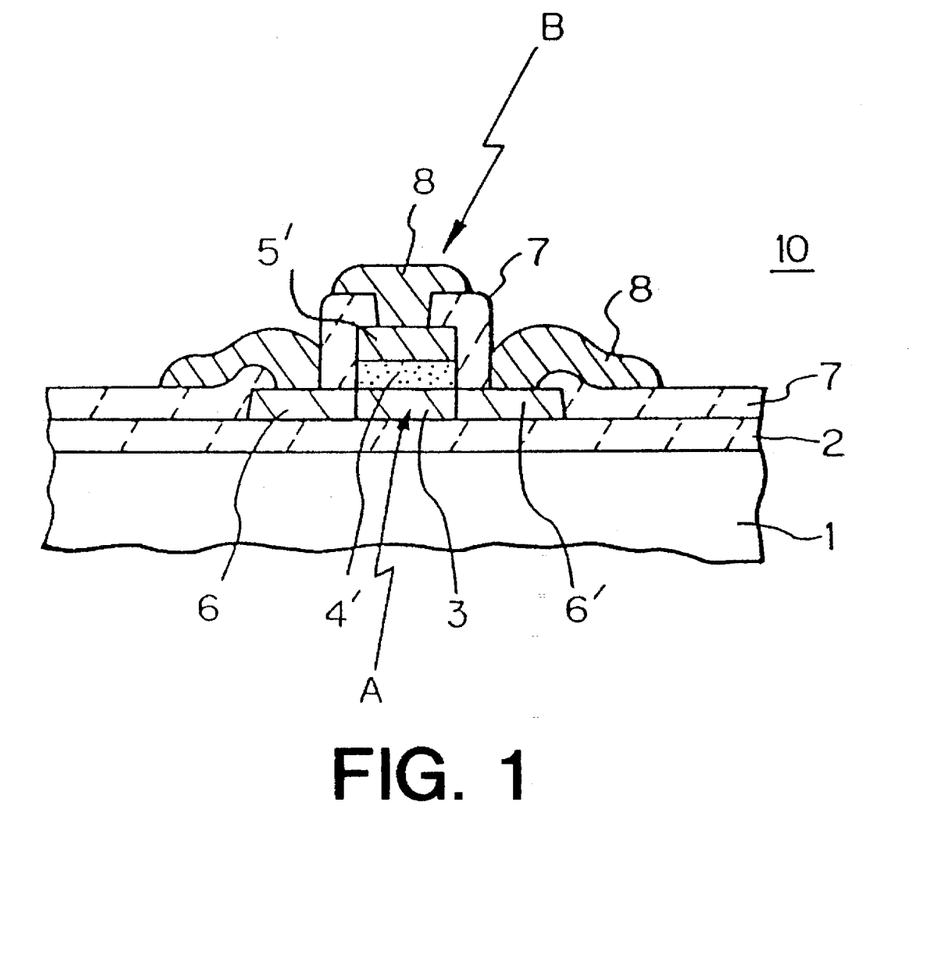
FIG. 1 shows cross section of a non-single crystal thin film transistor (TFT) according to one embodiment of the present invention.
Figure 2A:
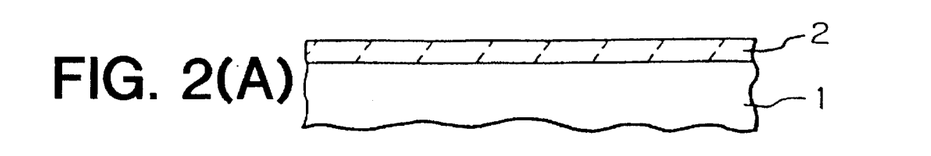
FIGS. 2A–2F show a part of producing steps of a non-single crystal thin film transistor (TFT) of one embodiment of the present invention.
Figure 2B:
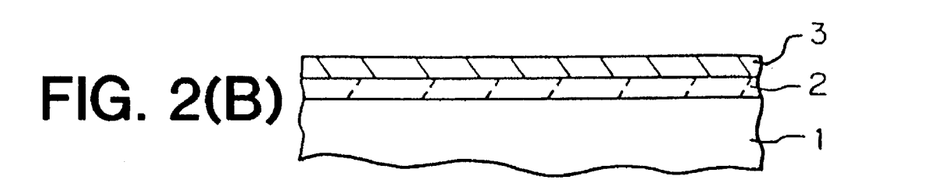
Figure 2C:
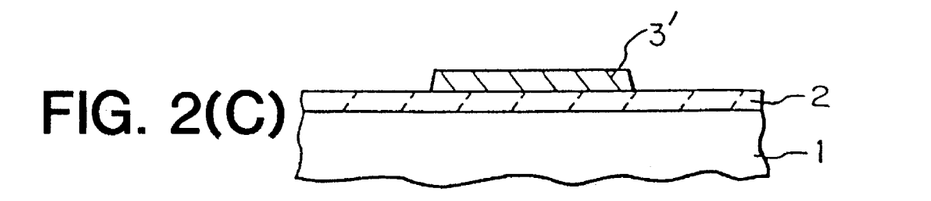
Figure 2D:
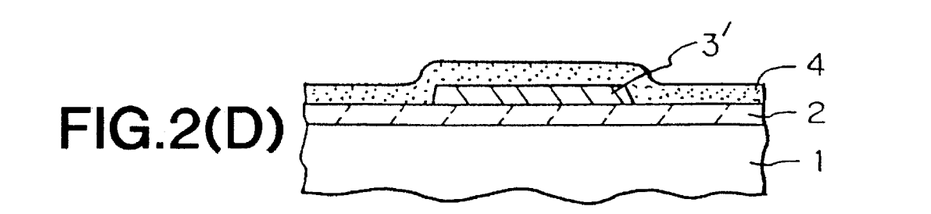
Figure 2E:
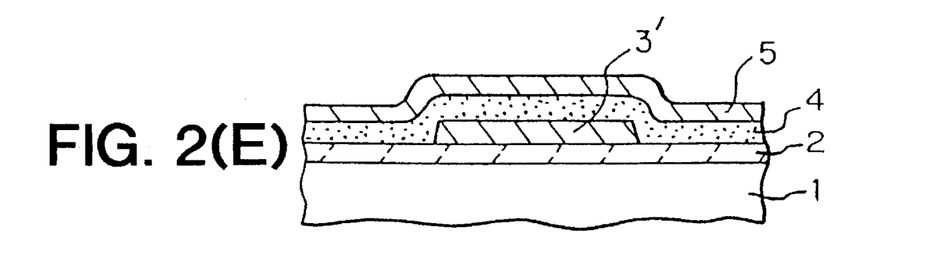
Figure 2F:
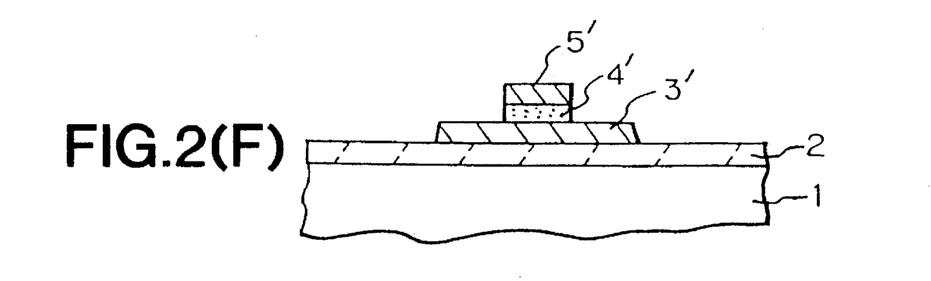
Figure 3A:
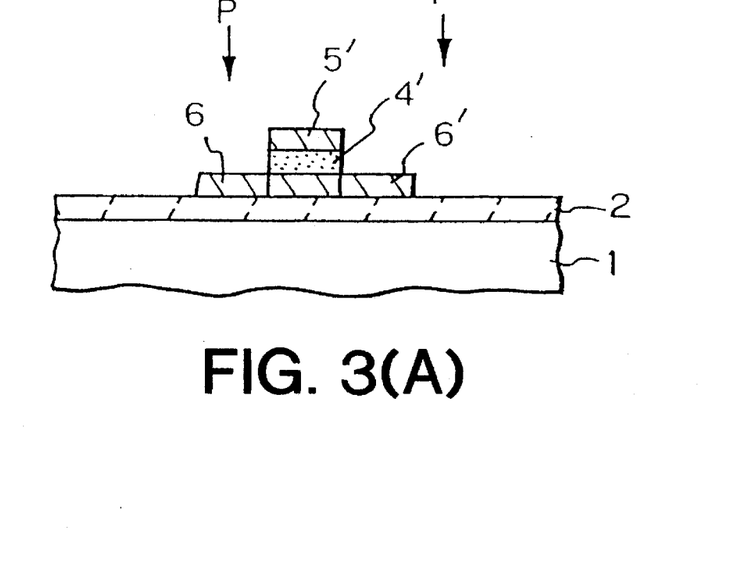
FIGS. 3A–3B show the rest of producing steps of a non-single crystal thin film transistor (TFT) following the steps of FIG. 2.
Figure 3B:
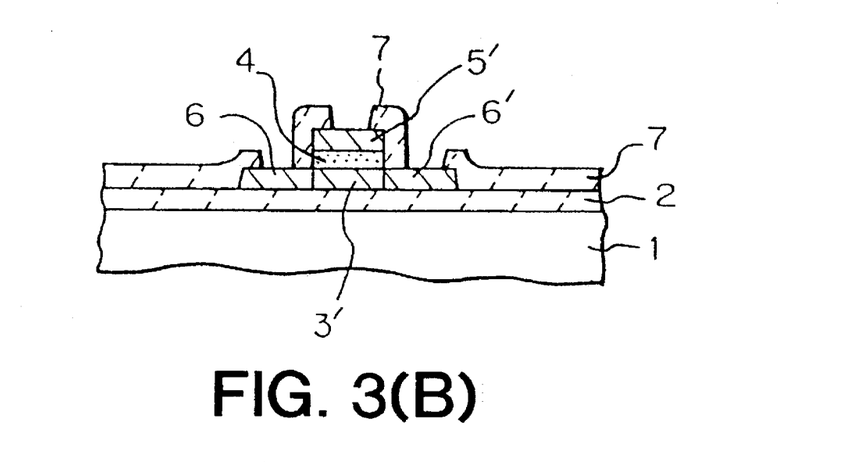
Figure 5:
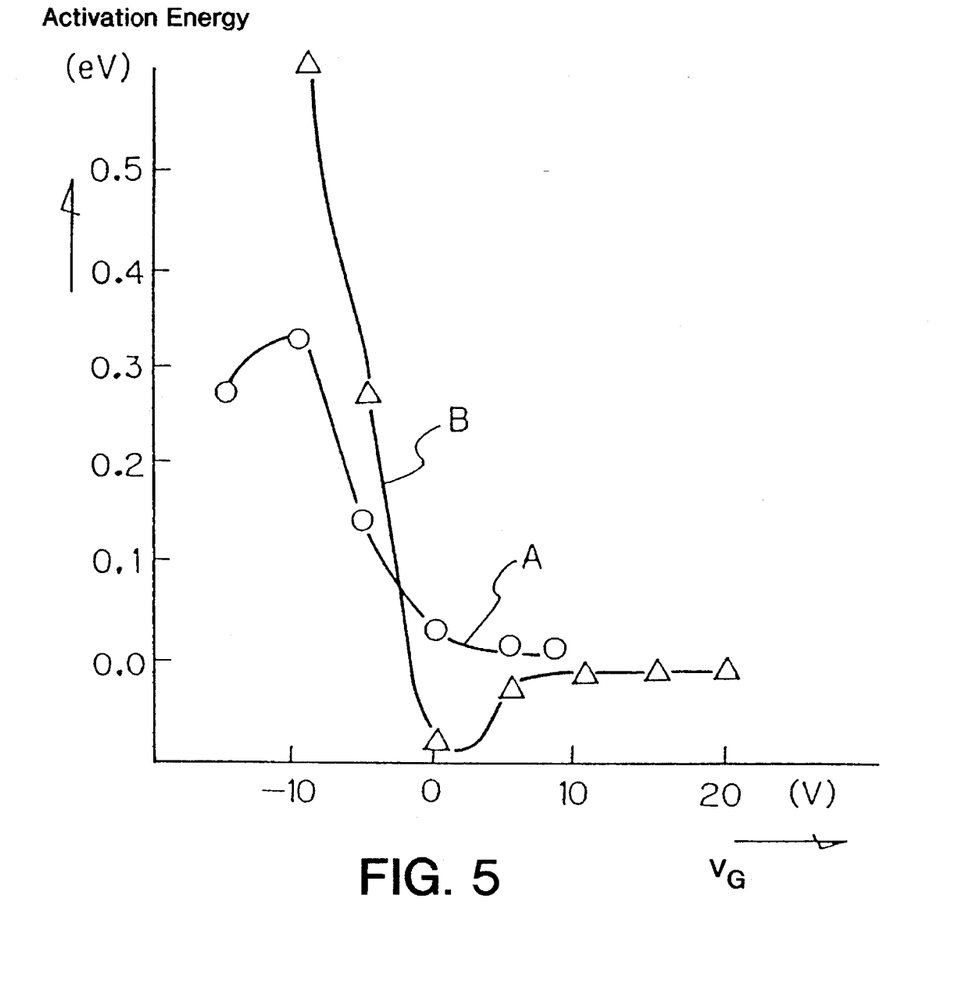
FIG. 5 shows curves showing comparison of the characteristics of the present non-single crystal thin film transistor with those of another TFT.
Figure 6:
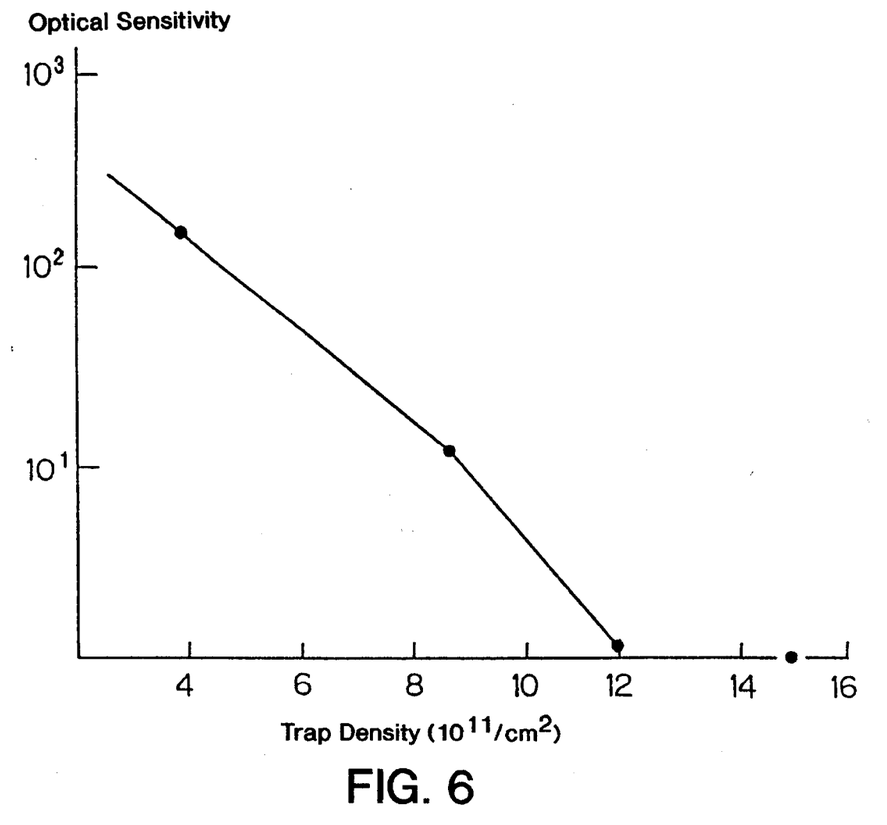
FIG. 6 shows curves of characteristics of an on-single crystal thin film transistor (TFT) of one embodiment of the present invention.
Figure 7A:
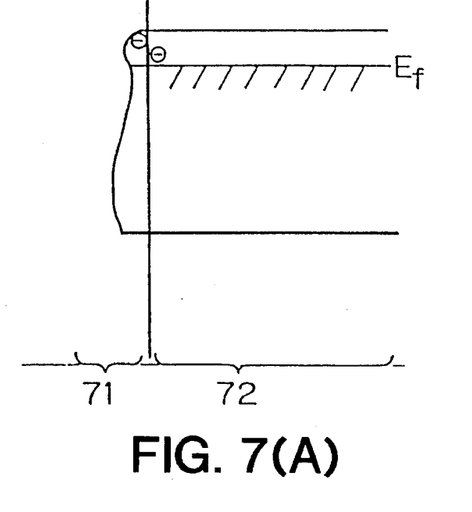
FIGS. 7A–7B show explanatory drawings of the operation of the present invention.
Figure 7B:
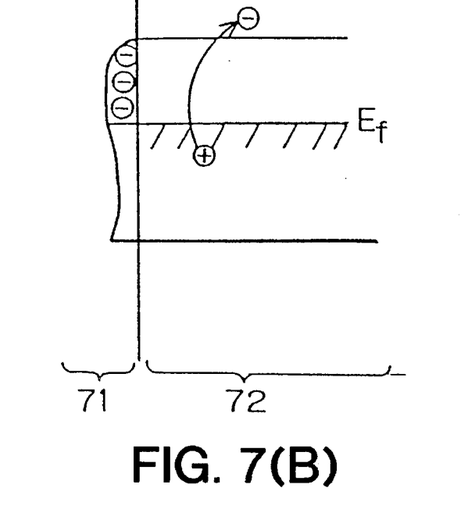

One embodiment of the present invention is now described in accordance with FIGS. 1 through 7. In those figures, FIG. 1 is a cross section of a thin film transistor (TFT) according to the present invention, FIGS. 2 and 3 show producing steps of the thin film transistor of FIG. 1, FIGS. 4 through 6 show characteristics of the thin film transistor according to the present invention, and FIG. 7 shows operational principle of a non-single crystal TFT which constitute the present solid state imaging device according to the present invention.

In FIG. 1, the numeral 1 is a substrate made of glass, 2 is an insulation film made of $SiO_2$, 3 is an active layer, 4' is a gate insulation layer, 5' is a gate electrode, 6 is a source region, 6' is a drain region, 7 is an insulation layer, 8 is an electrode, and 10 is a TFT.

The producing steps of the image sensor of FIG. 1 are now described in accordance with FIGS. 2 and 3.

(1) A substrate 1 is glass which is for instance supplied by Corning Company with the trade name 7059. An insulation film 2 made of $SiO_2$ is produced on the substrate 1 with the thickness 3000 ÅA through sputtering process (see FIG. 2 (A)). The substrate may be made of single crystal silicon, in that case, the surface of the substrate must be smoothened through reflow process before the insulation layer 2 is attached.

(2) Next step is to attach an amorphous silicon layer 3 (a-Si) on the insulation layer 2 with the thickness 800 Å through LPCVD (Low Pressure Chemical Vapor Deposition) process (see FIG. 2(B)).

The process condition is as follows.

| $Si_2H_6$ gas | 100–500 SCCM |
|---|---|
| He gas | 500 SCCM |
| Pressure | 0.1–1.0 Torr |
| Temperature | 430–500° C. |

(3) Next, the anneal process is effected to the amorphous silicon layer 3 produced in the above step (2).

The anneal process functions to crystallize said amorphous layer 3 which is produced through said LPCVD process. In the embodiment, the Excimer laser anneal (For instance KrF) is carried out so that the crystallized non-single crystal silicon layer is obtained.

A laser anneal process has the feature that the barrier height at grain border is small since a layer is melted with high temperature so that the borders of crystal grains are coupled with each other.

Insert the anneal process condition is as follows.

| Temperature of a substrate | 300–450° C. |
|---|---|
| Power | 250–450 mJ/cm$^2$ |
| Wavelength of a laser beam | 248 nm |
| Pulse width of a laser beam | 30 nsec |

(4) An island 3' is produced through patterning process to the non-single crystal silicon layer 3 which has been annealed (see FIG. 2(C)).

(5) An insulation layer 4 made of $SiO_2$ is attached with the thickness 1500 Å on the substrate 1 through TEOS (Tetraetoxy Silane) method as shown in FIG. 2 (D)). That insulation layer 4 constitutes a gate insulation film.

The process condition of the insulation layer 4 is as follows.

| TEOS gas | 10–50 SCCM |
|---|---|
| $O_2$ gas | 500 SCCM |
| Power | 50–300 Watts |
| Temperature | 400° C. |

(6) Next, an amorphous silicon layer 5 doped with phosphorus is attached on said layer 4 with the thickness 1000 Å through plasma CVD process (see FIG. 2 (E)). The layer 5 functions as a gate electrode.

The process condition for producing the amorphous layer 5 is as follows.

| $SiH_4$ gas | 10–50 SCCM |
|---|---|
| 5% $PH_3H_2$ gas | 5–20 SCCM |
| Pressure | 0.1–0.5 Torr |
| Power | 50–500 Watts |
| Temperature | 200–400° C. |

(7) The patterning operation is effected to the gate electrode layer 5 and the gate insulation layer 4 through etching process so that the gate insulation layer 4' and the gate electrode 5' are obtained (see FIG. 2 (F)).

(8) Phosphor is doped through ion doping process on the region of a source 6 and a drain 6' on an island 3' made of crystallized non-single crystal Si layer with the mask of a gate insulation layer 4' and a gate electrode 5' (see FIG. 3 (A)).

(9) The dopant is activated and the amorphous silicon layer 5' for a gate electrode is crystallized by heating the body at 550° C. for 5 hours in nitrogen atmosphere.

(10) Next, the body is hydrogenated by heating the same in hydrogen atmosphere so that the trap density of semiconductor layer is decreased.

The condition of the hydrogenation is as follows.

| | |
|---|---|
| $H_2$ gas | 100–1000 SCCM |
| Temperature | 300–450° C. |
| Pressure | Normal pressure |
| Process time | 30–120 minutes |

The hydrogenation is useful to decrease trap density on the border of an active layer 3' and a gate insulation layer 4 and improve quality of a layer. The present invention provides trap density less than $5\times10^{-11}/cm^2$ by specific process of an active layer and a gate insulation layer, and the hydrogenation.

(11) An inter layers insulation layer 7 made of $SiO_2$ is produced on the whole substrate through a TEOS method with the thickness 4000 Å.

The process condition of $SiO_2$ layer 7 is as follows.

| | |
|---|---|
| TEOS gas | 10–50 SCCM |
| $O_2$ gas | 500 SCCM |
| Power | 50–300 watts |
| Temperature | 400° C. |

After the $SiO_2$ layer 7 is produced, the patterning is carried out so that contact holes are obtained (see FIG. 3 (B)).

(12) Next, an aluminum layer is attached and is patterned so that an aluminum electrode 8 is provided as shown in FIG. 1. Thus, a thin film transistor (TFT) is obtained.

In the above step (8), phosphor (P) may be substituted with boron (B).

In the above constitution, input light A illuminates light receiving region between a drain and a source on an active layer 3' through a transparent substrate as shown in FIG. 1.

When an electrode 8 is made of ITO (Indium Tin Oxide), instead of aluminum, input light may illuminate an active layer through the electrode 8 as shown by B in FIG. 1.

Figure 4:
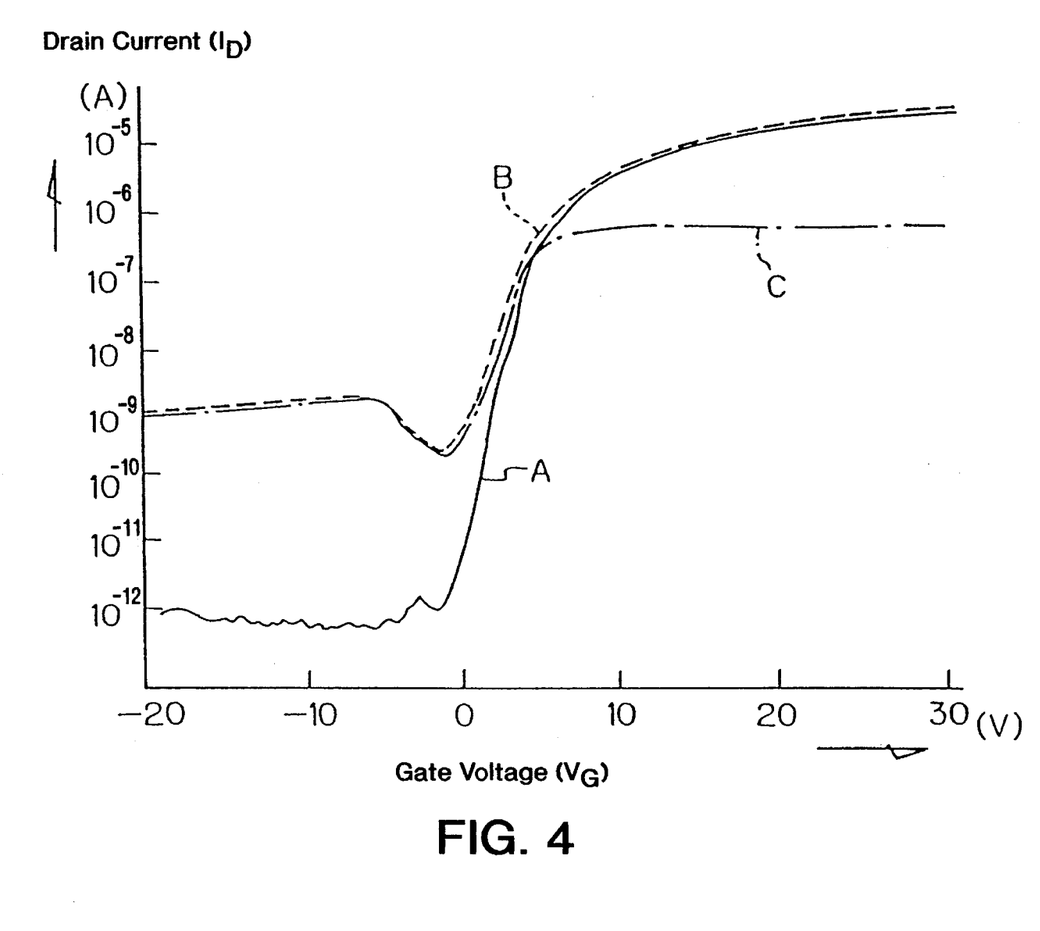
FIG. 4 shows curves of characteristics of a non-single crystal thin film transistor (TFT) of one embodiment of the present invention.

FIG. 4 shows the characteristic curves between drain current ($I_D$) and gate voltage ($V_G$) of a thin film transistor TFT which is produced as shown above.

In FIG. 4, the solid curve A shows the case that no light is input, the dotted line curve B shows the case when input light is applied, and the curve C is optical current which is the difference between two curves A and B.

The field effect mobility of the TFT in FIG. 4 is 70 $cm^2/V$ sec, $V_{th}$=2.3 V (threshold voltage), and trap density $N_t$=3.9× $10^{11}/cm^2$.

As apparent in the curves A and B in FIG. 4, the present TFT has sensitivity for input light. The curve A shows the case of no input light, and the curve B shows the case when illuminated, and the curve C which is the difference between two curves shows the optical sensitivity of the TFT. When gate voltage $V_G$ is higher than 7.5 V, no difference exists between the curves A and B, and drain current $I_D$ is constant.

Accordingly, when $V_G$<7.5 volt, the drain current $I_D$ with input light differs clearly from that with no input light. The difference of those $I_D$ is used as optical output or optical sensitivity.

When a TFT is in OFF state ($V_G$<0), drain current is less than $10^{-9}$ A, and when it is in the ON state ($V_G$>0), drain current or optical sensitivity is large. Therefore, preferably, gate bias is determined so that a transistor operates in the ON state.

The operation of the present invention is described with a thin film transistor of MOS structure deposited on an n-type silicon.

FIG. 7 shows energy level close to surface of n-type non-single crystal silicon of MOS structure. FIG. 7A is the case with no input light, and FIG. 7B is the case with input light.

In FIG. 7, 71 is a gate insulation layer, 72 is n-type non-single crystal silicon.

In FIG. 7A, when no input light illuminates, Fermi level $E_f$ is close to conductive band. When input light illuminates as shown in FIG. 7B, Fermi level shifts towards the center of valence electron band, since an electron moves from valence electron band to conductive band, and therefore, trap density around border of a gate insulation layer 71 increases, and an acceptor function becomes strong.

The shift of the Fermi level $E_f$ shifts the flat band potential of the MOS structure towards negative direction, and in a thin film transistor of that structure, threshold voltage ($V_{th}$) on drain current ($I_D$) versus gate voltage ($V_G$) shifts towards negative direction.

The shift of threshold voltage $V_{th}$ on ($I_D$–$V_G$) curve of a thin film transistor is expressed as follows.

$$\Delta I_D/\Delta V_{th} = -(I_D/(V_G-V_{th}))(1-N_t^2/KC_{ox}(V_G-V_{th})) \quad (1)$$

where $N_t$ is trap density of MOS structure, $C_{ox}$ is capacity of gate insulation film, and K is constant.

As is apparent in the above equation (1), the optical sensitivity of a thin film transistor (TFT) of MOS structure increases when the value of the right side of the equation (1) increases, in other words, the sensitivity increases when the second term in the equation (1) is close to 1. In other words, the value $N_t$ must be small enough, or close to zero. In the present invention, a non-single crystal silicon having the value $N_t$ close to zero is obtained by using a short pulse width laser like an Excimer laser for annealing when amorphous silicon is crystallized.

The value of $N_t$ is preferably less than $5\times10^{11}/cm^2$ when the present invention is used as a solid state image sensor.

The optical sensitivity of a thin film transistor of MOS structure according to the present invention is analyzed as follows.

The optical sensitivity of a thin film transistor depends upon an optical exciting carrier which is generated by the optical absorption in an active layer 3 of the thin film transistor 10 in FIG. 1.

An optical exciting carrier generated by optical absorption is collected to the border between a gate insulation layer 4' and an active layer 3, and as a result, the threshold voltage $V_{th}$ is shifted by $\Delta V_{th}$.

The value $\Delta V_{th}$ is expressed as follows.

$$\Delta V_{th} = -Q_0/C_{ox} \quad (2)$$

where $Q_0$ is total amount of charges (optical exciting carriers) excited by light, and $C_{ox}$ is capacitance of a gate insulation layer 4'.

Therefore, in order to have large $\Delta V_{th}$ in the equation (2), an optical exciting carrier must not be consumed in the process. In other words, the trap density at the border between a gate insulation layer 4' and an active layer 3 must be small.

The trap density $N_t$ of a non-single crystal silicon thin film transistor depends much upon producing steps of said transistor For instance, when an active layer is obtained by crystallizing amorphous silicon produced through an LPCVD process by thermal crystallization (less than 600° C.), the trap density $N_t$ is around $8\times10^{11}/cm^2$. On the other hand, when amorphous silicon is annealed by an Exima laser according to the-present invention, the trap density is $3.9\times 10^{11}/cm^2$, which is smaller than said value The value of Nt is further improved by hydrogenation Further, when multi-crystal silicon thin film transistor is produced on a glass substrate with-low temperature process less than 600° C., the value $N_t$ depends upon grain border of multi-crystal silicon (For instance, Levinson et al, J. Appl. Phys. Vol 52, pages 1193–1202 (1982)).

FIG. 5 shows the relations between activation energy for the gate voltage and gate voltge $V_G$ of a prior non-single crystal silicon TFT which is thermally crystallized after solid growth, and the present non-single crystal TFT which is crystallized by annealing using the Excimer laser.

The curve A in FIG. 5 shows the characteristics of activation energy of the prior art, and the curve B in FIG. 5 shows the characteristics of activation energy of the present invention.

As shown in the curve B in FIG. 5, the present non-single crystal silicon TFT which is annealed by using an Excimer laser has a negative activation energy in the region where gate voltage ($V_G$) is positive. That means that no effect by grain border is measured in that region.

It is analyzed that the annealing process by an Excimer laser finishes in a short time, and therefore, when amorphous silicon is crystallized, the crystallization is effected close to the crystal grain border, and it grows close to a single crystal. Therefore, the trap density $N_t$ is small.

Therefore, a thin film transistor produced according to the present invention has the characteristics that the total optical exciting carrier $Q_0$ depends upon input light as defined by the equation (2), and therefore, the value $\Delta V_{th}$ is shifted for instance in negative direction. In other words, it has optical amplification, and it has facility of a photo transistor.

FIG. 6 shows optical sensitivity of a thin film transistor when light by yellow LED (light emitting diode) of wavelength 565 nm and intensity 1000 lx is applied to said transistor, where gate voltage $V_G$ is −10 V. The horizontal axis shows trap density, and the vertical axis shows optical sensitivity.

As optical sensitivity higher than 100 is preferable in practice, the trap density is preferably less than $5\times10^{11}/cm^2$ in FIG. 6.

It should be noted that the measure of amplification of optical output is the difference of $I_D$ current (drain current) when illuminated and $I_D$ current with no illumination.

Although the embodiment has been described that an Excimer laser is used for annealing or crystallizing amorphous silicon, the present invention is not restricted to the use of an Excimer laser, but any annealing is available so long as trap density after annealing is lower than $5\times10^{11}/cm^2$.

Figure 8:
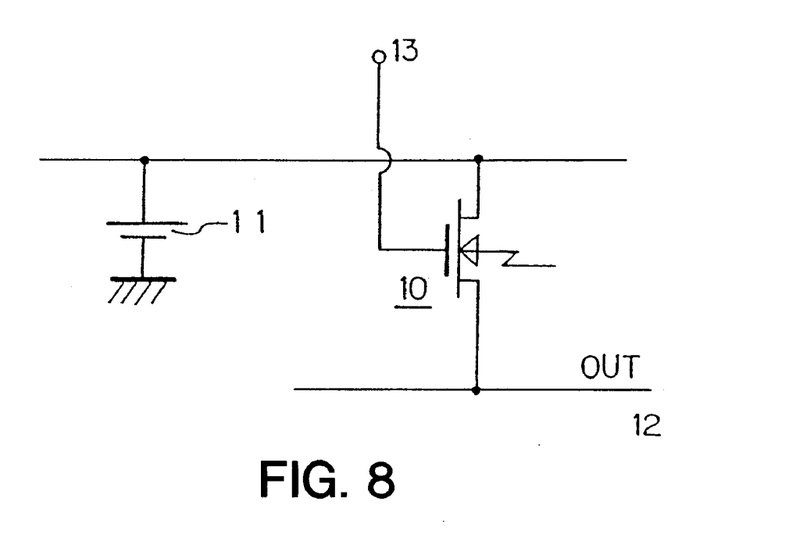
FIG. 8 shows an example of a circuit diagram using the present invention.

According to the present invention which has non-single crystal silicon TFT with trap density less than $5\times10^{11}/cm^2$, the transistor has optical-electrical conversion facility, a sensor portion for sensing light and a switching portion may be mounted in a single element as shown in FIG. 8. In other words, an image sensor with a switching element, is obtained.

In FIG. 8, the numeral 10 is non-single crystal silicon thin film transistor which has optical-electrical conversion facility, 11 is a bias source, 12 is a video output line for providing electrical output, and 13 is a gate line for applying bias potential. In FIG. 8, light which illuminates region between a source and a drain, provides electrical output of the non-single crystal silicon thin film transistor with high sensitivity.

Next, another producing step of the present invention is described in accordance with FIGS. 9 and 10, which show a pair of drive elements or switching elements in right portion, and a solid state image sensor in left portion. An image sensor portion operates to provide electrical output depending upon optical input, and drive portion functions to operate said image sensor portion.

Figure 9A:
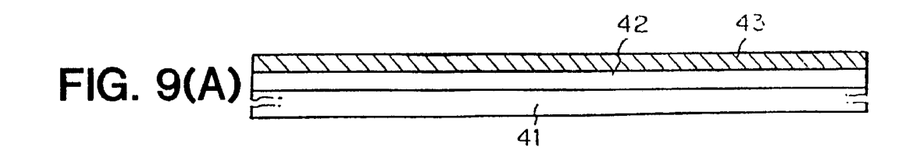
FIGS. 9A–9F show the producing steps of the embodiment of the present invention.

First, a multi-crystal silicon substrate 41 in FIG. 9A is covered with silicon oxide layer 42 with thickness 300 nm after said substrate is processed with reflow layer. The layer is produced through thermal oxidation process. If the substrate 41 includes impurity, a further silicon oxide layer is produced through LPCVD.

The silicon oxide layer 42 corresponds to the insulation layer 2 in FIG. 1, and functions to prevent a carrier to escape from an active layer to a substrate.

After the insulation layer 42 is produced on the silicon substrate-41, an amorphous silicon layer 43 is produced with thickness 200 nm through plasma CVD process on the insulation layer 42. The process condition for providing amorphous silicon layer is as follows.

| Reaction temperature | 200° C. |
|---|---|
| Reaction pressure | 5.3 Pa |
| Radio frequency power | 35 W |
| Layer growth speed | 6 nm/minute |

The amorphous silicon layer 43 is crystallized by heating the same at 600° C. for 24 hours in nitrogen atmosphere at normal pressure. The crystallized silicon layer 43 constitute a source/drain region and a silicon active layer. If the silicon layer 43 is too thin, undesirable contact trouble and/or breaking of wires occurs since silicon diffuses into aluminum at a contact point with aluminum wiring which is described later. In particular, if the thickness of the layer 43 is less than 30 nm, the producing yield rate and operational reliability decrease considerably.

On the other hand, if the thickness of the layer 43 is larger than 1 μm, it would be difficult to control stress in the layer, and undesirable micro cracks and/or defects would occur, and electrical characteristics of a transistor would not be uniform and operational reliability of a transistor would decrease. Further, when the thickness of the layer 43 is too thick, the producing time of the layer would be longer, and the productivity would decrease.

In the above analysis, the preferable range of the thickness of the layer 43 is in the range between 30 nm and 1 μm.

Figure 9B:
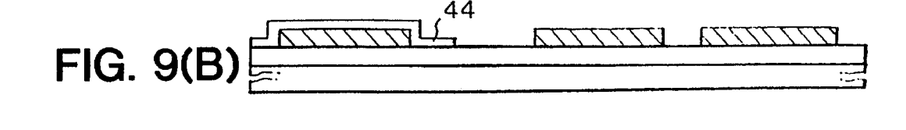

The crystallized silicon layer 43 thus obtained is patterned, and then, the silicon oxide layer 44 is attached through an LPCVD process with the thickness 100 nm on the whole surface. The silicon oxide layer 44 is removed except the portion of an image sensor in left portion in the figure. The silicon oxide layer 44 functions as a gate insulation layer as shown in FIG. 9B.

Figure 9C:
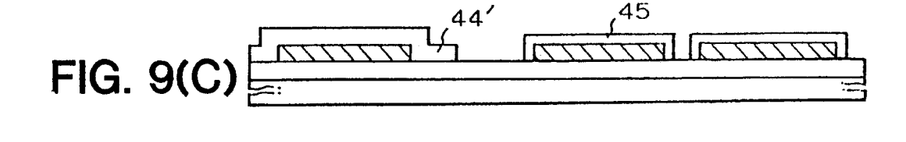

Then, another silicon oxide layer 45 which constitutes a gate insulation layer of a drive circuit is produced through thermal oxidation process. The thickness of the layer 45 is larger than 100 nm. The gate insulation layer 44 produced previously is combined with the gate insulation layer 45, and is denoted as 44'.

The gate insulation layers are produced as mentioned above so that a gate insulation layer of an image sensor and a gate insulation layer of a drive circuit have the best electrical characteristics.

The upper limit of the thickness of the gate insulation layer is 300 nm. If the thickness is larger than 300 nm, the amplification facility would not be enough. The lower limit of the thickness is 20 nm. Considering that the drive voltage of a solid state image sensor (left portion of the figure) is 5–20 V, and the ununiformness of a layer and long term operational reliability, it is necessary that the thickness is larger than 20 nm.

Although a gate insulation layer is produced for an image sensor and a drive circuit separately in the above embodiment, a common gate insulation layer would be possible so long as the necessary electrical characteristics are obtained.

In the embodiment, all the gate insulation layer for a drive circuit, and at least a part of a gate insulation layer for an image sensor are produced by thermally oxided silicon layer, because of electrical characteristics and long term operational reliability.

We found in our experiment that electrical characteristics of a MOS type transistor depends upon whether it is produced through thermal oxidation processes or not. A transistor produced through thermal oxidation processes has lower threshold voltage and larger ratio of ON and OFF. Further, a transistor with gate insulation layer produced through thermal oxidation process keeps electrical characteristics stably for a long time.

After the gate insulation layers 44' and 45 are produced, $N^+$type multi-crystal silicon layer 46 which constitutes a gate electrode is produced with the thickness 300 nm through LPCVD process. In the producing process, phosphor is doped higher than $1 \times 10^{20}$ atoms/cm$^2$ (see FIG. 9D).

Figure 9D:
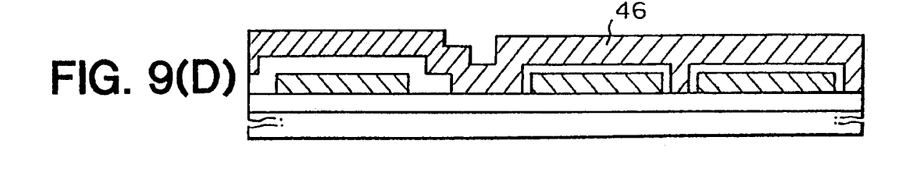

Next, the multi-crystal silicon layer 46 is patterned through dry etching step, and a part of upper portion of the silicon oxide layers 44' and 45 which constitute a gate insulation layer are also removed through etching step.

The remaining portions 47–49 of multi-crystal silicon layer operate as a gate electrode.

Figure 9E:
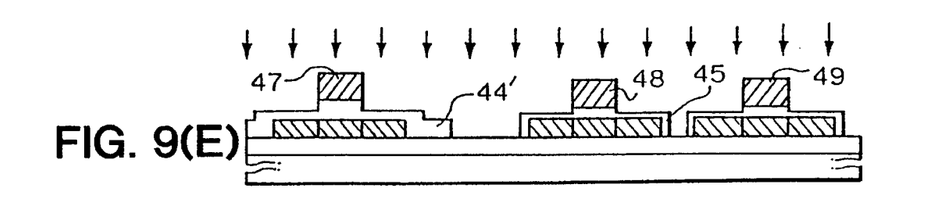

Next, N-type impurity, phosphor, is injected through ion injection step or ion doping step by approximate $1 \times 10^{15}$ atoms/cm$^2$ with an acceleration voltage 70 kV (FIG. 9E).

Figure 9F:
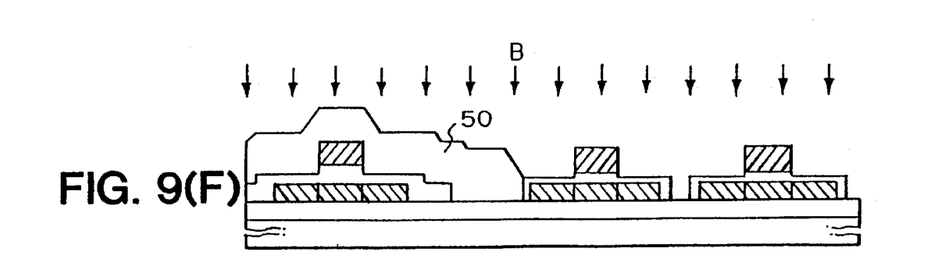

Further, a portion where no P type impurity is injected is covered with a resist 50, and boron is injected by $5 \times 10^{15}$ atoms/cm$^2$ with acceleration voltage 40 kV (FIG. 9F).

FIG. 9F shows the case that boron is injected to only two elements in the right portion in the figure.

In order to activate the injected impurities, it is thermally annealed at 600° C. for 12 hours in nitrogen atmosphere.

Figure 10A:
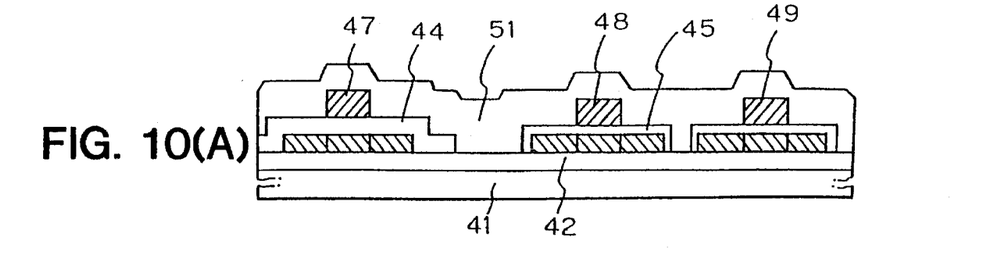
FIGS. 10A–10D show the continuation of the producing steps of the embodiment of the present invention.

Next, silicon oxide layer 51 for inter-layer insulation is produced with thickness 800 nm through normal pressure CVD process (FIG. 10A).

Figure 10B:
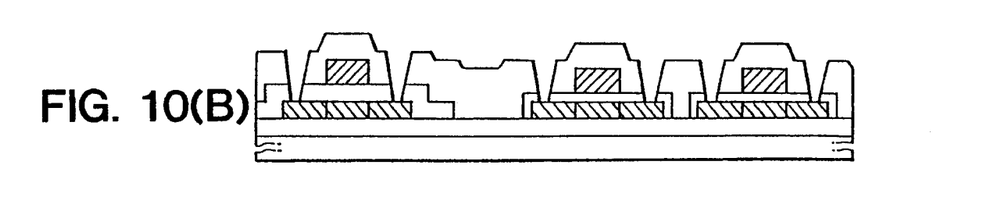

The inter-layer insulation layer may be PSG (Phosphosilicate glass) layer. A contact hole is then provided (FIG. 10B).

Figure 10C:
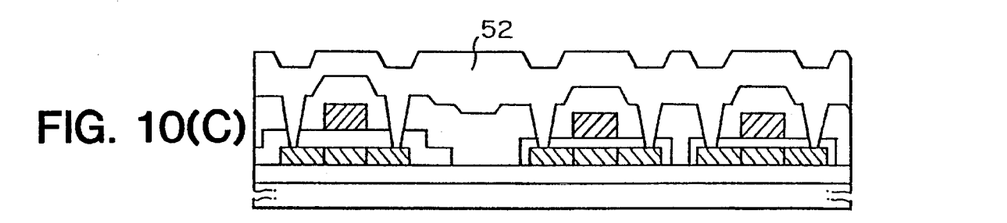
Figure 10D:
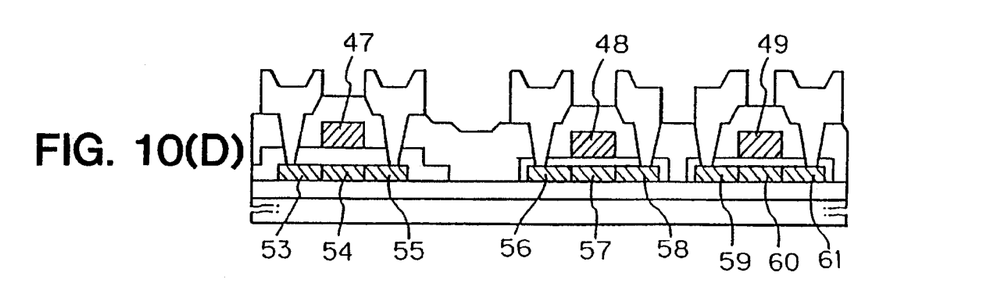

Then, aluminum layer 52 is produced through sputter process, and that layer 52 is patterned so that aluminum wiring is produced (FIG. 10C, FIG. 10D).

Finally, in order to improve electrical characteristics, an anneal process is carried out at 350° C. for one hour in hydrogen atmosphere as hydrogenation process. Then, an image sensor and a drive element are completed at the same time.

An image sensor thus produced has a gate electrode 47, source/drain electrodes 53 and 55, and an active layer region (channel region) 54. Two transistors in drive region have the similar structure, a first transistor having a gate electrode 48, source/drain regions 56 and 58, an an active layer 57, a second transistor having a gate electrode 49, source/drain regions 59 and 61, and an active layer 60.

The next embodiment produces a solid state image sensor on a single crystal silicon substrate, and a drive element is produced on the same substrate by using the single crystal silicon of the substrate.

FIGS. 11 and 12 show the producing steps. In those figures, two MOS type transistors are produced in right portion of the figures through conventional LSI process, one is N-channel type, and the other is P-channel type. Those MOS transistors operate to drive a solid state image sensor, and may be in CMOS structure. In left portion of the figures, a solid state image sensor by a thin film semiconductor is produced.

Figure 11A:
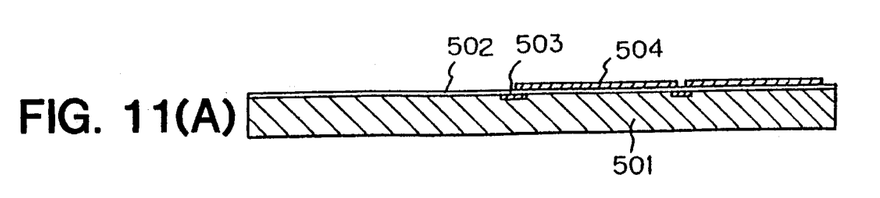
FIGS. 11A–11E show another producing steps of the embodiment of the present invention.

The substrate 501 is in the present embodiment N-type single crystal silicon substrate. First, silicon oxide layer 502 is attached on the N-type single crystal silicon substrate 501 for stress buffer purpose through a thermal oxidation step. Next a channel stopper 503 is doped, and a silicon nitride 504 is selectively attached for selective oxidation (FIG. 11A).

Figure 11B:
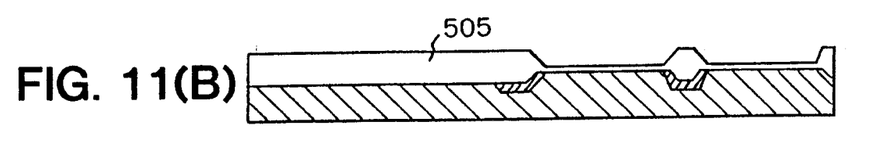

Then, an oxide layer 505 is produced through steam oxidation step. Then, silicon nitride layer 504 is removed (FIG. 11B).

Figure 11C:
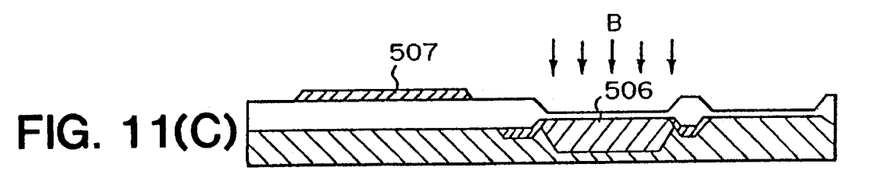

Next, a portion for N-channel MOS transistor is covered with a resist, and then, boron is doped through ion injection process at the region 506 for P-channel MOS transistor. After the resist is removed, the amorphous silicon layer is produced through a plasma CVD process, followed by heating process for providing crystallized silicon layer, and patterning process, an island of crystallized silicon layer 507 is provided. The island of crystallized silicon layer 507 is used as an active layer of a solid state image sensor (FIG. 11C).

The heating process for providing crystallized silicon layer 507 is carried out at high temperature around 800° C. or higher, and therefore, an excellent crystallized layer is obtained. This is possible because the substrate is made of a single crystal silicon substrate, which is free from deformation or contraction during the heating process.

Figure 11D:
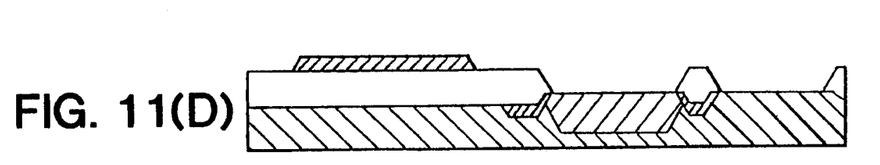

Then, the silicon oxide layer 502 for stress buffer purpose is removed (FIG. 11D).

Figure 11E:
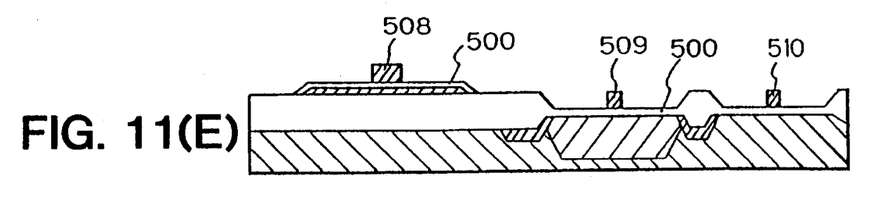

Then, a gate insulation layer 500 made of silicon oxide layer obtained thermally is produced, and gate electrodes 508, 509 and 510 made of $n^+$poly-silicon with thickness about 300 nm followed by a patterning step are provided (FIG. 11E).

In FIG. 11E, 508 is a gate electrode of an image sensor, and 509 and 510 are a gate electrode of a MOS transistor for driving said image sensor.

Figure 12A:
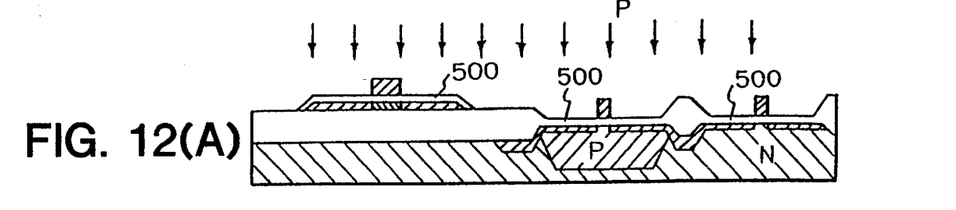
FIGS. 12A–12D show continuation of the producing steps of the embodiment of the present invention.

Next, phosphor is doped on the whole area through ion injection step by $1 \times 10^{15}$ atoms/cm$^2$ (FIG. 12A).

Figure 12B:
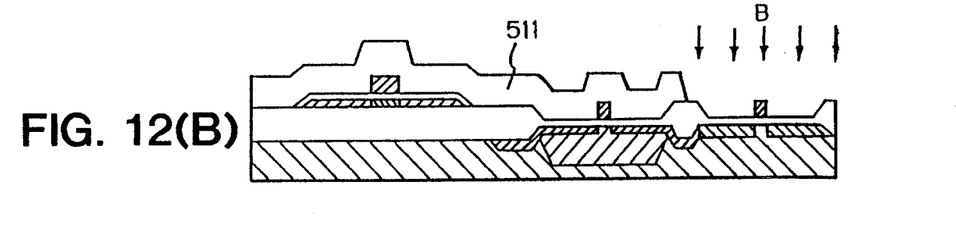

Next, a portion for an N-type transistor is covered with a resist 511, and boron is doped through ion injection step by $5 \times 10^{15}$ atoms/cm$^2$ (FIG. 12B).

Figure 12C:
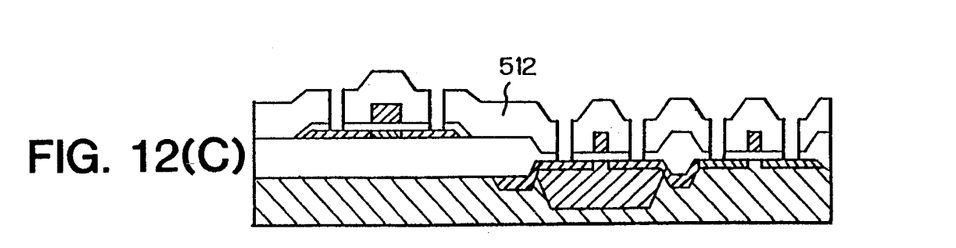

After the resist 511 is removed, anneal process is carried out in nitrogen atmosphere for 12 hours at 600° C. so that impurities thus injected are activated. Further, an insulation layer 512 for inter-element insulation is provided through normal pressure CVD process by thickness 800 nm, and contact holes for wiring are provided on said insulation layer 512 (FIG. 12C).

Figure 12D:
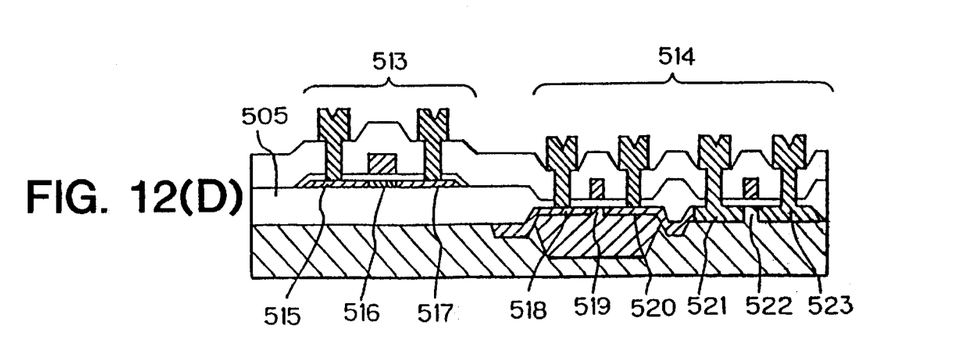

Next, metal wiring by aluminum is provided through sputtering process which is followed by patterning process (FIG. 12D).

Finally, an anneal process in hydrogen atmosphere at 350° C. for one hour is carried out as hydrogenation process for improving electrical characteristics of a transistor. Thus, a solid state image sensor 513 on an insulation layer 505, and drive circuit elements 514 on a single crystal silicon substrate are completed at the same time.

As shown in FIG. 12D, an image sensor 513 is provided on an insulation layer 505, and having N-type source/drain region 515/517, and an active layer 516 as channel region.

A drive circuit has an N-channel MOS transistor having N-type source/drain region 518/520 and a channel region (active layer) 519, and a P-channel MOS transistor having source/drain region 521/523 and a channel region (active layer) 522.

The embodiment shows the case that one image sensor and a pair of drive MOS transistors are mounted on a common silicon substrate. Of course, it should be appreciated that number of image sensors and/or drive circuits mounted on a common substrate may be designed arbitrary, and it is of course a design matter whether a transistor and/or an image sensor is P-channel type or N-channel type.

APPLICATION FOR INDUSTRY

As mentioned above in detail, an image sensor of MOS structure having an active layer made of thin film non-single crystal silicon layer has been obtained. Said active layer is produced by laser anneal step or by annealing at high temperature amorphous silicon layer. Preferably, the thickness of an active layer is 30–1000 nm, and the thickness of a gate insulation layer is 20–300 nm. As the producing steps of the present image sensor are the same as those of a MOS transistor, a drive circuit including a switching element and/or a shift register for operating the image sensor is produced through thin film technique at the same time as the image sensor.

The optical response time of the image sensor is quick in the order of 500 μsec, and plane operation is possible by arranging image sensors on a plane. Therefore, the present invention may be used as an image reader in a facsimile device, and/or an image reader for high speed reading.

What is claimed is:

1. A solid state image sensor comprising;

a substrate having insulation surface, an active layer of non-single crystal silicon layer provided on said insulation surface, having at least a source region and a drain region, a gate electrode layer provided on light receiving region between said source region and said drain region on said active layer through a gate insulation layer, a source electrode layer and a drain electrode layer each provided on said source region and said drain region, respectively, trap density of said active layer being less than $5 \times 10^{11}/cm^2$, said gate electrode layer being provided a predetermined bias potential, and electrical output of current between said source electrode layer and said drain electrode layer being provided depending upon input light which illuminates said light receiving region on said active layer.

2. A solid state image sensor according to claim 1, wherein said gate electrode layer is made of an Indium-Tin-Oxide, ITO, layer, and said input light is introduced to said light receiving region through said gate electrode layer.

3. a solid state image sensor according to claim 1, wherein said substrate is transparent for input light, and said input light is introduced to said light receiving region through said substrate.

4. a solid state image sensor according to claim 1, wherein said bias potential is determined so that a circuit between a source electrode and a drain electrode is in an ON state.

5. A solid state image sensor according to claim 1, wherein absolute value of said bias potential is less than 7.5 V.

6. A solid state image sensor according to claim 1, wherein said bias potential is determined so that a circuit between a source electrode and a drain electrode is in an OFF state.

7. A solid state image sensor according to claim 1, wherein said substrate is made of non-single crystal silicon.

8. A solid state image sensor according to claim 1, wherein said substrate is made of glass.

9. A solid state image sensor according to claim 1, wherein said active layer is a non-single crystal silicon layer which is obtained by crystallizing amorphous silicon layer through anneal process with a laser pulse and hydrogenation process.

10. A solid state image sensor according to claim 1, wherein a thickness of said active layer is in the range between 20 nm and 1000 nm, a thickness of said gate insulation layer is in the range between 20 nm and 300 nm, and said active layer is a non-single crystal silicon layer obtained by crystallizing said amorphous silicon layer through anneal process at higher than 600° C., and hydrogenating the same.

11. A solid state image sensor according to claim 1, wherein said substrate mounts thin film MOS transistors for a switching element and a shift register for operating said image sensor.

\* \* \* \* \*